US008452560B2

(12) United States Patent
Novikov et al.

(10) Patent No.: US 8,452,560 B2
(45) Date of Patent: May 28, 2013

(54) IDENTIFYING PERIODIC JITTER IN A SIGNAL

(75) Inventors: Vladimir M. Novikov, Arcadia, CA (US); Thomas L. Boyd, Sherwood, OR (US); Ye Shen, Canoga Park, CA (US); Dwayne R. Wedlaw, Thousand Oaks, CA (US); Alfred Jesse Wilkinson, Newbury Park, CA (US)

(73) Assignee: Teradyne, Inc., North Reading, MA (US)

( * ) Notice: Subject to any disclaimer, the term of this patent is extended or adjusted under 35 U.S.C. 154(b) by 251 days.

(21) Appl. No.: 11/966,248

(22) Filed: Dec. 28, 2007

(65) Prior Publication Data

US 2008/0162060 A1    Jul. 3, 2008

Related U.S. Application Data

(60) Provisional application No. 60/877,824, filed on Dec. 29, 2006.

(51) Int. Cl.
*G01R 29/00*    (2006.01)
*G06F 17/18*    (2006.01)

(52) U.S. Cl.
USPC ............................................ 702/69; 702/179

(58) Field of Classification Search
USPC ............... 702/179–181, 66, 69–71, 73, 74, 702/124, 126, 183, 189, 190, 193, 198; 324/612–613; 714/724, 819, 709; 375/224–228, 375/371
See application file for complete search history.

(56) References Cited

U.S. PATENT DOCUMENTS

| | | | |
|---|---|---|---|
| 6,694,462 B1 | 2/2004 | Reiss et al. | |
| 7,254,168 B2* | 8/2007 | Guenther | 375/226 |
| 2003/0115017 A1* | 6/2003 | Sun et al. | 702/181 |
| 2004/0260492 A1 | 12/2004 | Halle et al. | |
| 2006/0167652 A1* | 7/2006 | Stimple | 702/179 |
| 2006/0251200 A1 | 11/2006 | Miller | |
| 2007/0118315 A1* | 5/2007 | Panis et al. | 702/69 |

FOREIGN PATENT DOCUMENTS
WO    WO02/12909    2/2002

OTHER PUBLICATIONS

International Search Report and Written Opinion in Application No. PCT/US2007/089020, dated Jun. 13, 2008.
International Preliminary Report on Patentability in Application No. PCT/US2007/089020, dated Jul. 9, 2009.
Bevington, P., "Data Reduction and Error Analysis for the Physical Sciences", $2^{nd}$ Ed., McGraw Hill (1992).
Hong et al., "An Efficient Random Jitter Measurement Technique Using Fast Comparator Sampling", $23^{rd}$ IEEE VLSI Test Symposium (VTS'05) (2005).
Press et al., "Numerical Recipes in C", $2^{nd}$ Ed., Cambridge University Press (1992).

(Continued)

*Primary Examiner* — Michael Nghiem
*Assistant Examiner* — Ricky Ngon
(74) *Attorney, Agent, or Firm* — Fish & Richardson P.C.

(57) ABSTRACT

Identifying periodic jitter in a signal includes identifying transition regions of the signal, where the transition regions correspond to regions of the signal where the signal changes between different levels, determining lengths of the transition regions; and performing a statistical analysis that is based on the lengths of the transition regions in order to obtain a value indicative of a level of periodic jitter in the signal.

25 Claims, 7 Drawing Sheets

OTHER PUBLICATIONS

"Fibre Channel—Methodologies for jitter and signal quality specification—MJSQ", Nat'l Comm. for Information Tech. Standardization, Aug. 24, 2001.

Agilent Technologies, "Using bathtub jitter software with the Agilent 86130A and 71612C error performance analyzers", Agilent Technologies Appl. Note 1550-12 (2002).

Cai, Y. et al, "Jitter testing for multi-gigabit backplane SerDes—techniques to decompose and combine various types of jitter", Proc. Int'l Test Conf. (ITC), 2002, pp. 700-708.

Dalal, W. et al., "Measuring jitter of high speed data channels using undersampling techniques", Proc. Int'l Test Conf. (ITC), 1998, pp. 814-818.

Hafed, M. et al., "A 5-channel, variable resolution, 10 GHz sampling rate coherent tester / oscilloscope IC and associated test vehicles", Proc. CICC, 2003.

Hafed, M. et al., "A standalone integrated test core for time and frequency-domain measurements", Proc. Int'l Test Conf. (ITC), 2000.

Hong et al., "BER Estimation for Serial Links Based on Jitter Spectrum and Clock Recovery Characteristics", Proc. Int'l Test Conf. (ITC), 2004, pp. 1138-1147.

Li, M. et al., "A new method for jitter decomposition through its distribution tail fitting", Proc. Int'l Test Conf. (ITC), 1999, pp. 788-794.

Ou, N. et al, "Jitter models for the design and test of Gbps-speed serial interconnects", IEEE Design & Test of Computers, Jul.-Aug. 2004, pp. 302-313.

Partin, J. and Li, M., "Comparison and correlation of signal integrity measurement techniques", DesignCon 2002.

Sunter, S. et al., "An automated, complete, structural test solution for SerDes", Proc. Int'l Test Conf (ITC), 2004.

Sunter, S. et al., "On-chip digital jitter measurement, from megahertz to gigahertz", IEEE Design & Test of Computers, Jul.-Aug. 2004, pp. 314-321.

Yamaguchi, T. et al., "Extraction of instantaneous and RMS sinusoidal jitter using an analytic signal method", IEEE Trans. Circuits & Systems, vol. 50, No. 6, Jun. 2003, pp. 288-298.

\* cited by examiner

IDENTIFYING PERIODIC JITTER IN A SIGNAL

CROSS-REFERENCE TO RELATED APPLICATION

This patent application claims priority to U.S. Provisional Application No. 60/877,824, which was filed on Dec. 29, 2006. U.S. Provisional Application No. 60/877,824 is hereby incorporated by reference into this patent application as if set forth herein in full.

TECHNICAL FIELD

This patent application relates generally to identifying periodic jitter in a signal and, more particularly, to doing so in the context of automatic test equipment (ATE).

BACKGROUND

ATE refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. ATE is capable of providing signals to a DUT via its source channel. A capture channel receives signals from the DUT and forwards those signals for processing to determine whether the DUT meets testing qualifications.

Functionality testing is one step in the manufacturing process of integrated circuits (ICs). ATE should test the devices as quickly (to reduce cost of the testing) and accurately (to allow grading the devices according to performance) as possible.

One characteristics of a DUT is its Bit Error Rate (BER). A DUT's BER may be defined as ratio of number of bits incorrectly received to the total number of bits sent during a specified time interval. With modern applications requiring BER (Bit Error Rate) to be about $10^{-12}$ or less, it is impractical to measure BER directly. For example, at a 3.125 gigabit-per-second (GB/s) data rate, about one faulty bit occurs per 5.4 minutes, on average.

Jitter is known to be a main contributor to BER and is an indirect indicator of BER. Therefore, jitter is often measured in order to determine the quality of a DUT's communication. Although jitter can be measured via a variety of methods, traditionally, a limited number of measurement techniques have been implemented in ATE.

SUMMARY

This patent application describes methods and apparatus, including computer program products, for identifying periodic jitter in a signal.

Periodic jitter can be caused by a number of sources, and can adversely affect results of a test performed on the DUT (e.g., by ATE). For example, periodic jitter (e.g., from an external source) can cause the test to fail, thereby indicating a device failure on a known passing device.

Jitter is evident in transitional regions of a signal (e.g., from low to high or from high to low). For example, jitter may cause the signal to transition at a different point from cycle to cycle in observed samples when undersampling is used. Random jitter (which is device-produced) produces transition lengths that have a Gaussian or close to Gaussian distribution. On the other hand, periodic jitter causes the distribution to deviate from pure Gaussian. A chi-square test is used to determine a value that indicates the extent to which the distribution of transition lengths deviates from pure Gaussian. This value is indicative of the amount of periodic jitter in the signal.

Once periodic jitter is identified, a customer can be notified and can take appropriate action to identify the source of the periodic jitter and silence it.

Described herein is a method for identifying periodic jitter in a signal. The method comprises identifying transition regions of the signal, where the transition regions correspond to regions of the signal where the signal changes between different levels, determining lengths of the transition regions, and performing a statistical analysis that is based on the lengths of the transition regions in order to obtain a value indicative of a level of periodic jitter in the signal. The method may include one or more of the following features, either alone or in combinations.

Performing the statistical analysis may comprise determining a distribution of the lengths of the transition regions, determining a mean and a standard deviation of the distribution, and performing a chi-square ($\chi^2$) analysis using the lengths, the mean, and the standard deviation in order to obtain the value. A higher value obtained through the $\chi^2$ analysis may indicate more periodic jitter in the signal than does a lower value obtained through the $\chi^2$ analysis. A Gaussian distribution of transition lengths may be indicative of pure random jitter, and a level of periodic jitter in the signal may correspond to an amount that the distribution deviates from the Gaussian distribution.

The mean, $\mu$, may determined as follows:

$$\mu = \frac{\sum_{i=1}^{M} L_i}{M},$$

where $L_i$ corresponds to a transition region, and M corresponds to a number of transition regions. The standard deviation, $\sigma$, may be determined as follows:

$$\sigma = \sqrt{\frac{\sum_{i=1}^{M} (L_i - \mu)^2}{M-1}}.$$

N(L) corresponds to an occurrence of a transition length L, and $N_b$ corresponds to a number of transition lengths that fall within $\mu+\sigma$ and $\mu-\sigma$. $N(L)_{Theor}$ corresponds to an expected number of transition lengths L. $N(L)_{Theor}$ may be determined as follows:

$$N(L)_{Theor} = \left(\sum_i N(i) - N(1)\right) \times \left[CDF\left(\frac{N(L)+0.5-\mu}{\sigma}\right) - CDF\left(\frac{N(L)-0.5-\mu}{\sigma}\right)\right];$$

where CDF is a cumulative density function. $\chi^2$ may be determined as follows:

$$\chi^2 = \sum_{N_b} \frac{(N(L) - N(L)_{Theor})^2}{N(L)_{Theor}}$$

where the value, $\chi_v^2$, which is indicative of a level of periodic jitter in the signal, may be determined as follows:

$$\chi_v^2 = \frac{\chi^2}{N_b - 2}.$$

The signal in which jitter is identified may be a digital signal comprised of bits. Identifying the transition region may comprise defining a number of bits that comprise a stable region of the signal, where the stable region comprises a number of bits having a same level, and identifying a portion of the bits where bits transition between different levels. The portion comprises a number of bits that is less than a number of bits in the stable region. The bits may be obtained by undersampling an original signal and reordering resulting samples produced by the undersampling.

The method may be performed by automatic test equipment (ATE), and the signal may be received at the ATE from a device being tested by the ATE.

This patent application also describes ATE for performing the foregoing method, including any one or more of the foregoing features, either alone or in combination. The ATE includes a testing device communicatively coupled to a device under test. The testing device comprises circuitry to exchange signals with the device under test. The signals comprise a test signal received from the device under test. A processing device is communicatively coupled to the testing device. The processing device is configured to execute instructions to perform the foregoing method.

The foregoing method may be implemented as a computer program product comprised of instructions that are stored on one or more machine-readable media, and that are executable on one or more processing devices. The foregoing method may be implemented as an apparatus or system that includes one or more processing devices and memory to store executable instructions to implement the method.

This patent application also describes a method for use in testing a device, which comprises attempting to identify periodic jitter in a signal received from the device using a statistical method that is based on a chi-square ($\chi^2$) analysis, and providing an indication of whether the signal contains periodic jitter. The statistical method may be performed according to any one or more of the processes described above.

The foregoing method may be implemented as a computer program product comprised of instructions that are stored on one or more machine-readable media, and that are executable on one or more processing devices. The foregoing method may be implemented as an apparatus or system that includes one or more processing devices and memory to store executable instructions to implement the method.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
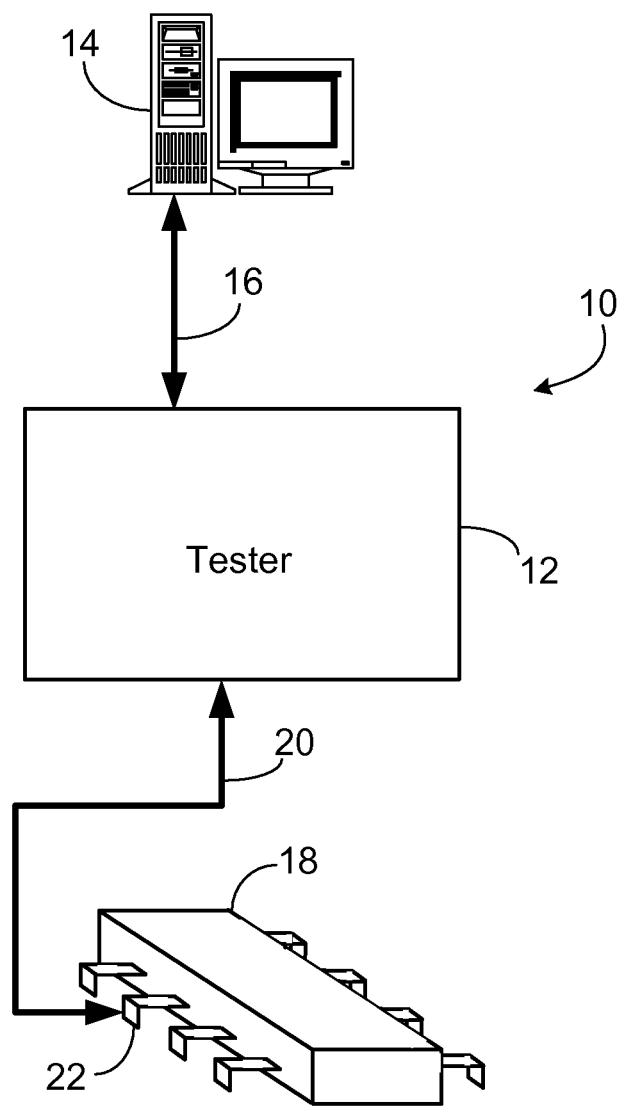
FIG. 1 is a block diagram of ATE for testing devices.

Referring to FIG. 1, an ATE system 10 for testing a device-under-test (DUT) 18, such as a semiconductor device, includes a tester 12. To control tester 12, system 10 includes a computer system 14 that interfaces with tester 12 over a hardwire connection 16. Typically, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., an arbitrary number, for instance, as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device 18 to tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
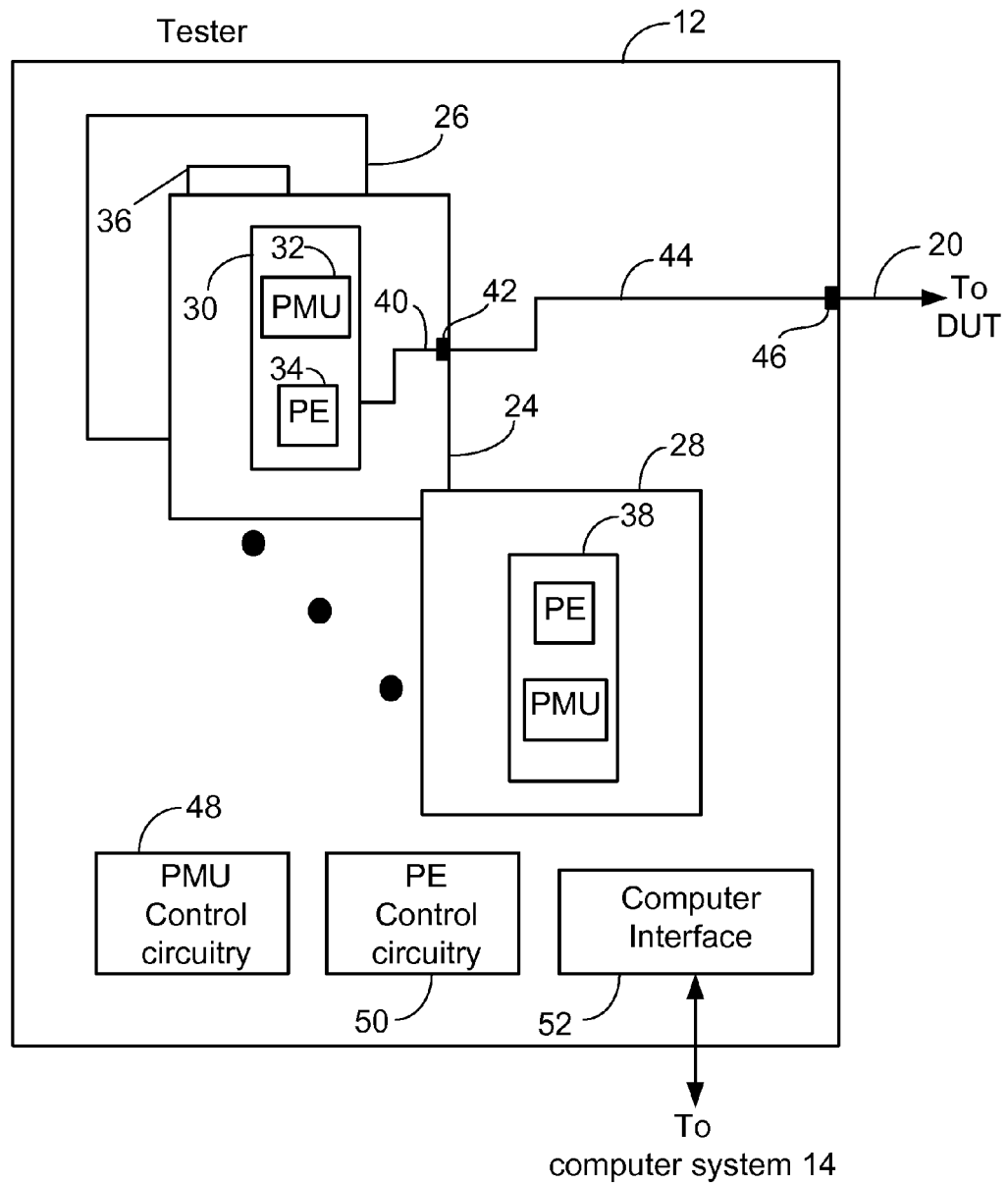
FIG. 2 is a block diagram of a tester used in the ATE.

Referring also to FIG. 2, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since tests may be performed in parallel. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32.

To pass both DC and AC test signals from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from tester 12 to the DUI. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also includes a computer interface 52 that allows computer system 14 to control the operations executed by tester 12 and also allows data (e.g., test parameters, DUT responses, etc.) to pass between tester 12 and computer system 14

The ATE obtains data on a DUT pin, upon which jitter is to be measured, using binary undersampling, in particular, a walking strobe method. This method allows the ATE to measure jitter without the use of external instruments, which reduces the amount of time needed to perform jitter measurement. U.S. Pat. Nos. 6,694,462 and 6,609,077 describe walking strobe undersampling, and are hereby incorporated by reference into this application as if set forth herein in full.

The following describes how ATE 10 identifies periodic jitter (PJ) in a signal received from the DUT and, if the PJ exceeds a tolerable level, outputs an indication (e.g., a warning). In this implementation, a process for identifying PJ may be performed on computer system 14; however, all or some processing may be performed in tester 12.

Figure 3:
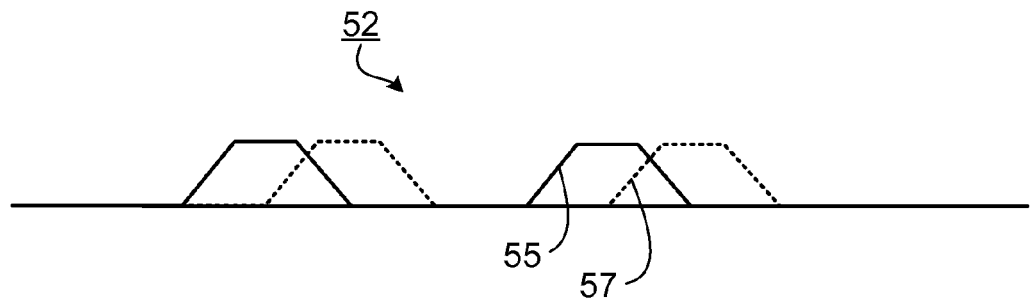
FIG. 3 shows a signal and the same signal, with jitter.

For the purposes of this application, jitter includes, and can be defined by, a variation of a signal edge from its ideal position in time. This can include, e.g., time-shifting and/or elongation of the signals. For example, as shown in FIG. 3, position 55 corresponds to the ideal position of signal 56 and position 57 corresponds to a position in the presence of jitter. Jitter is generally divided into two types: deterministic jitter (DJ) and random jitter (RJ). DJ may be correlated to known sources, while RJ is due to sources that can be characterized statistically. DJ also can be divided into two parts: periodic jitter (PJ) and data-dependent jitter (DJ). PJ is periodic, meaning that it repeats over time, while DDJ is substantially constant, meaning that its offset is relatively consistent across different signal edges. Therefore, each pattern edge will have the same DDJ when observed multiple times.

Figure 4:
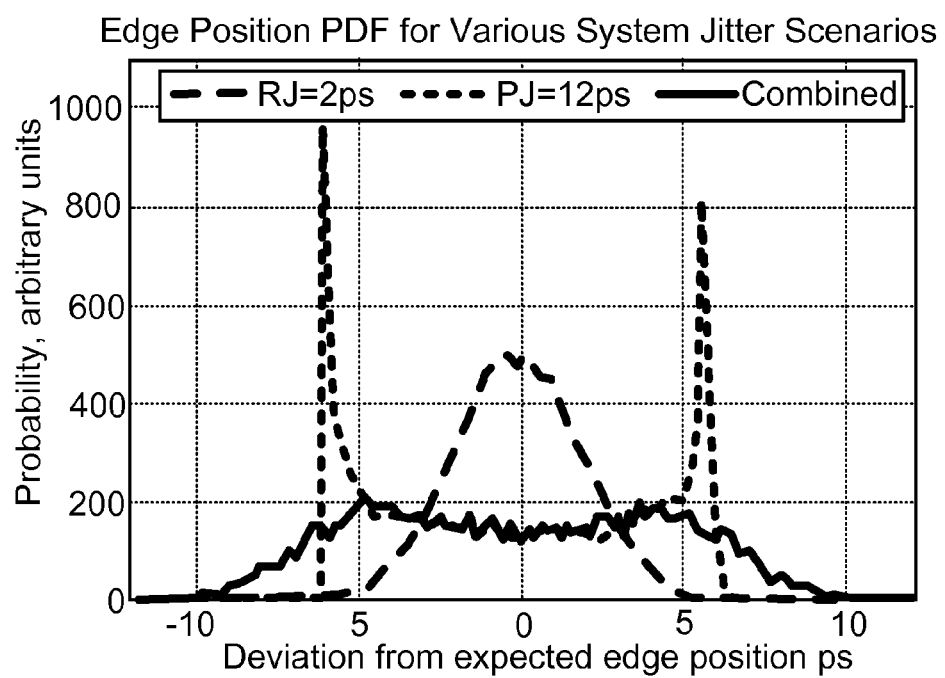
FIG. 4 is a graph showing how a probability density function (PDF) of an edge location in time is affected by sources of jitter, including random jitter (RJ) and periodic jitter (PJ).

Each component of jitter can be characterized by a probability density function (PDF) that corresponds to a deviation of a signal edge from its ideal position in time. DDJ, as noted above, corresponds to a constant offset of an edge position in time; PJ varies with time according to $A \cdot \sin(F_{pj}*t+\text{phase offset})$ (where "A" is amplitude, "$F_{pj}$" is PJ frequency (radians/sec), and "t" is time); and RJ is random in time and has a normal (Gaussian) distribution. FIG. 4 shows PDFs for three different cases: (1) pure RJ ($\sigma=2$ picoseconds (ps)), (2) pure PJ (12 ps, peak-to-peak), and (3) a combination of both RJ ($\sigma=2$ ps) and PJ (12 ps, peak-to-peak). Here, $\sigma$, is the standard deviation from the mean value. It is noted that each curve in FIG. 4 is generated based on 10,000 simulated data samples.

For at least the reasons explained above, PJ can represent a significant threat to accurate measurement of DUT jitter. For example, a DUT's RJ of 4.0 ps would be measured as 5.78 ps if a PJ of 12 ps (peak-to-peak) is present, which represents about a 45% error. Process 60 (FIG. 5) identifies PJ in sampled data using a chi-square ($\chi^2$) test for statistical distributions. Other statistical distribution tests can be substituted for the chi-square ($\chi^2$) test in FIG. 5 to identify PJ in sampled data. For example, the Jarque-Bera (JB) test may be used. The Jarque-Bera test is a goodness-of-fit measure that is indicative of departure from a predefined norm, which is determined based on sampled kurtosis and skewness. The Jarque-Bera test may also be used to identify the level of PJ in sampled data by identifying a deviation from an expected norm (e.g., a Gaussian), which indicates that the sampled data is polluted by non-random jitter, e.g., PJ.

Referring now to process 60 (see FIG. 5), in the $\chi^2$ test, a distribution of signal edge transition lengths is tested for its proximity to a theoretical Gaussian (normal) distribution. Specifically, the distribution of signal edge transition lengths is used to determine a $\chi^2$ value. A large number for the $\chi^2$ value, e.g., much greater than one, indicates that the signal is polluted by non-random jitter, e.g., PJ. Depending on the level of pollution, a warning or other indication may be issued.

Figure 5:
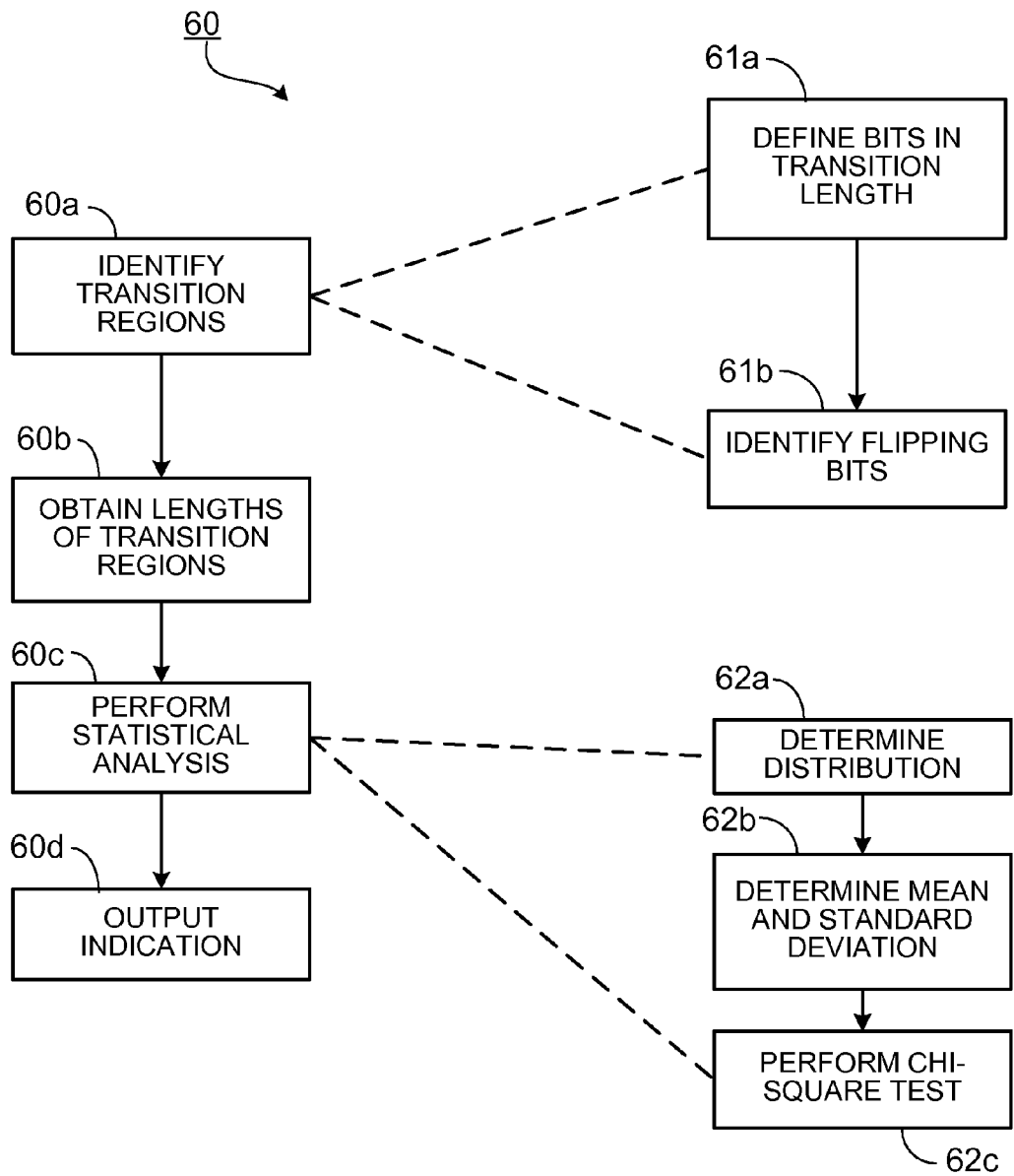
FIG. 5 is a flowchart showing a process for detecting periodic jitter.

FIG. 5 is a flowchart showing actions performed by process 60. It is noted that process 60 may include actions in addition to those shown in FIG. 5. Referring to FIG. 5, process 60 identifies (60a) transition regions in sampled data. In this implementation, identifying a transition region includes defining (61a) a transition length and identifying (61b) a portion of bits in a data stream that transition (i.e., flip) between levels. Process 60 also obtains (60b) lengths of the transition regions, as described below.

In more detail, process 60 identifies signal edge transition lengths in data from a DUT. A comparator on tester 14 (e.g., on interface card 24) samples incoming data from the DUT using an undersampling technique, such as the walking strobe sampling method described in U.S. Pat. No. 6,694,462. This sampling method is used to capture data from high frequency signals, such as those received from a serializer/deserializer (SerDes). Data that is sampled according to the walking strobe method may need to be reordered in computer system 14 so that the data is time-sequential. A process for reordering the data is described in U.S. Patent Application No. 2004/0260492, which is hereby incorporated by reference into this application as if set forth herein in full.

The sampled data contains transition regions that include "flipping" bits, which are surrounded by regions of stable bits. In this context, flipping bits refers to bits that change from zero to one, or vice versa, in a region that is less than a predefined length (which may correspond to the length of a stable region). A region is designated a transition region because it constitutes a part of the data stream in which a signal represented by the bits is transitioning from one value to another value.

In the example shown below, the flipping bits are 1001010110. This region is bordered by a region of stable zero-value bits and a region of stable one-value bits, both of which have lengths that are greater than the length of the transition region.

... 00000000000001001010110111111111111 ...

A transition length is determined based on a number of bits in the transition region. The transition length, L, is an integer value $N_{bits}+1$, where $N_{bits}$ is the number of bits in a transition region. The shortest possible transition corresponds to a border between stable areas of bits, i.e., with no flipping bits, as follows: ... 000111 .... This transition region can be assigned a value of L=0 or L=1. In this implementation, a value of "1" is used. It is noted that, for the purposes of process 60, the following two transitions are identical, since both have a transition length of four:

... 000100111 ... and ... 000110111 ...

Process 60 identifies the transition regions by identifying stable regions followed by flipping bits. If the flipping bits are less than, or in some cases equal to, the predefined length of a transition region, then the region in question is designated a transition region. If the transition region is too wide, an error will be generated. Process 60 also records (e.g., stores in memory) the length of each transition region.

At a fixed sampling resolution, signal edge transition lengths depend, in part, on the amount of RJ in the system. The larger the RJ is, the longer the transition length is. PJ will also increase the transition length. The same amplitude of PJ in the system will have a greater effect on smaller RJ than on larger RJ. This is shown below in Table 1.

TABLE 1

| System | | PJ, peak-to-peak, ps | | |
|---|---|---|---|---|
| RJ, ps | No PJ | 4 | 8 | 12 |
| 2 | 25.1 | 33.2 | 47.9 | 65.5 |
| 8 | 143.9 | 148.3 | 153.2 | 164.9 |

The average transition length in the sampled data does not provide an indication as to whether the main source of the total jitter (TV) is RJ or PJ. To determine the amount of PJ in the data, process 60 first considers a distribution of the transition lengths. In this implementation, a population of several hundred transitions may be used.

Referring to FIG. 5, process 60 performs (60c) a statistical analysis that is based on the lengths of the transition regions in order to obtain a value that is indicative of a level of PJ, or a lack of PJ, in the signal. More specifically, using the population of transition lengths, process 60 determines (62a) a distribution. Determining the distribution includes binning the data using a pre-selected bin size. Since the transition lengths are all integer values, the smallest bin size that can be used is one. Selecting a bin size greater than one can adversely affect detection of PJ in the acquired jitter data.

Process 60 determines (62b) a mean ($\mu$) and standard deviation ($\sigma$) of the transition lengths distribution, as follows:

$$\mu = \frac{\sum_{i=1}^{N} L_i}{N} \quad (1)$$

$$\sigma = \sqrt{S^2} = \sqrt{\frac{\sum_{i=1}^{N} (L_i - \mu)^2}{N-1}} \quad (2)$$

In above equations (1) and (2), N represents the number of transition regions.

As noted above, when only RJ is present in the system, the transition lengths will have a Gaussian (normal) distribution. Pollution of the data by PJ deteriorates the transition lengths distribution. The higher the level of PJ in the system, the greater the deviation of the resultant length distribution from Gaussian.

Process 60 performs (62c) a $\chi^2$ statistical test to determine the amount by which the transition lengths distribution deviates from a Gaussian distribution. When PJ is absent or low, in the data, the resulting $\chi^2$ value is small (e.g., one or less). When the amount of PJ is high, the resulting $\chi^2$ value is large (e.g., greater than one). In this context, the terms "low" and "high" refer to the relative amount of PJ as measured, e.g., by the ratio of PJ/RJ. It is noted that the presence of DDJ in the system does not affect the determination of PJ, because DDJ acts only as an offset to $\mu$ and does not affect $\sigma$.

In more detail, once a population of transition lengths $\{L_i\}$ has been obtained, the following actions are performed by process 60 to obtain the $\chi^2$ value. Process 60 bins the population $\{L_i\}$ using a bin size of one. Each bin is defined as N(L), where N is an occurrence of the length L in the population.

Process 60 excludes N(1) (i.e., transition lengths with L=1) from consideration. In the presence of PJ, the $\{L_i\}$ is often abundant in the samples N(1), while the rest of the population is concentrated around the mean value of the distribution, which is typically much greater than one (>>1). Having N(1) be considered may lead to an erroneous estimate of parameters µ and σ for the distribution. This erroneous estimate forces computation of $\chi^2$ over an area that is low in statistics, which results in too low a value for $\chi^2$, which can indicate a lack of PJ in the data even when PJ is present.

Process 60 determines µ and σ using equations (1) and (2) based on the samples of the population $\{Li\}$ that were not excluded. Parameters µ and σ represent a distribution from which the population $\{L_i\}$ is, theoretically, drawn.

Figure 6:
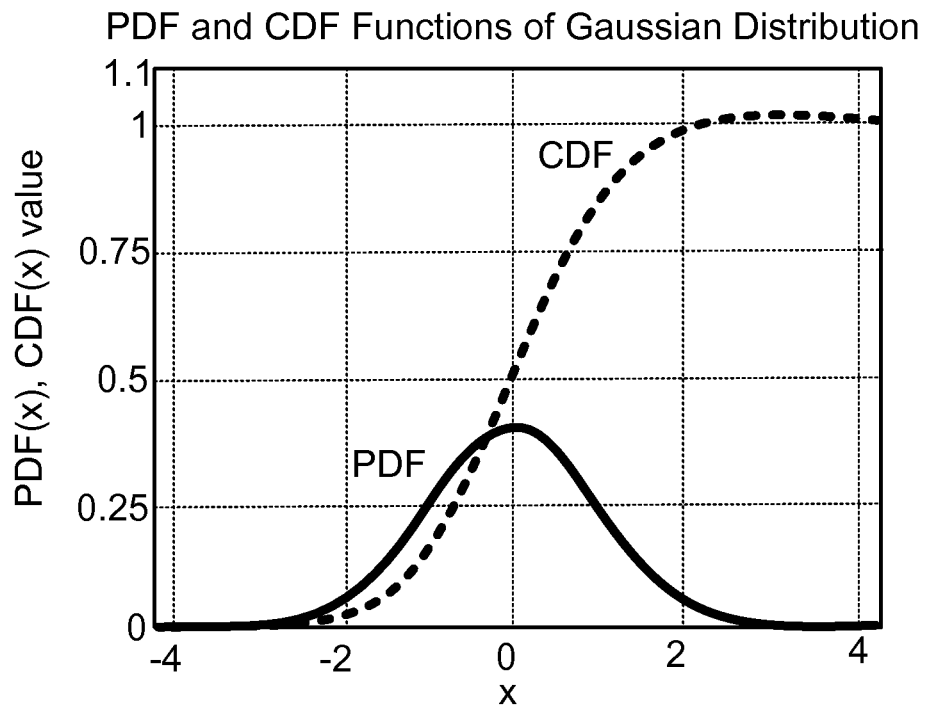
FIG. 6 is a graph showing a PDF and a cumulative density function (CDF) of a normalized ($\mu=0$, $\sigma=1$) Gaussian distribution.

Process 60 designates bins to be used for determination of $\chi^2$ as bins that fall into the area that has the mean of the population as its center value, i.e., (µ−σ, µ+σ). In this example, $N_b$ is the total number of bins used in determining the $\chi^2$ value. Process 60 determines a theoretical expectation, $N(L)_{Theor}$, for each bin used in the $\chi^2$ determination. To determine $N(L)_{Theor}$, a cumulative density function (CDF) of the Gaussian distribution is used. The CDF is shown on FIG. 6, along with its corresponding PDF. The formula for determining $N(L)_{Theor}$ is as follows:

$$N(L)_{Theor} = \left(\sum_i N(i) - N(1)\right) \times \left[CDF\left(\frac{N(L) + 0.5 - \mu}{\sigma}\right) - CDF\left(\frac{N(L) - 0.5 - \mu}{\sigma}\right)\right] \quad (3)$$

Process 60 determines a value $\chi^2$, as follows:

$$\chi^3 = \sum_{Nb} \frac{(N(L) - N(L)_{Theor})^2}{N(L)_{Theor}} \quad (4)$$

Using this value for $\chi^2$, process 60 determines a value, $\chi_v^2$, as follows:

$$\chi_v^2 = \frac{\chi^2}{N_b - 2}. \quad (5)$$

The value, $\chi_v^2$, is indicative of an amount by which the distribution of the transition lengths deviates from Gaussian. A relatively low value for $\chi_v^2$ (e.g., less than or about one) indicates that there is little or no PJ in the data, whereas a relatively high value for $\chi_v^2$ (e.g., greater than, or much greater, than one) indicates the presence of PJ in the data. The higher the value is for $\chi_v^2$, the more periodic jitter is present in the data.

Referring to FIG. 5, process 60 outputs (60d) an indication, such as a warning on computer system 14, if the chi-square test indicates the presence of PJ. The indication may also indicate if the level of PJ is relatively high or low. In response, a user may attempt to locate the source of the PJ, and silence it if possible.

Figure 7:
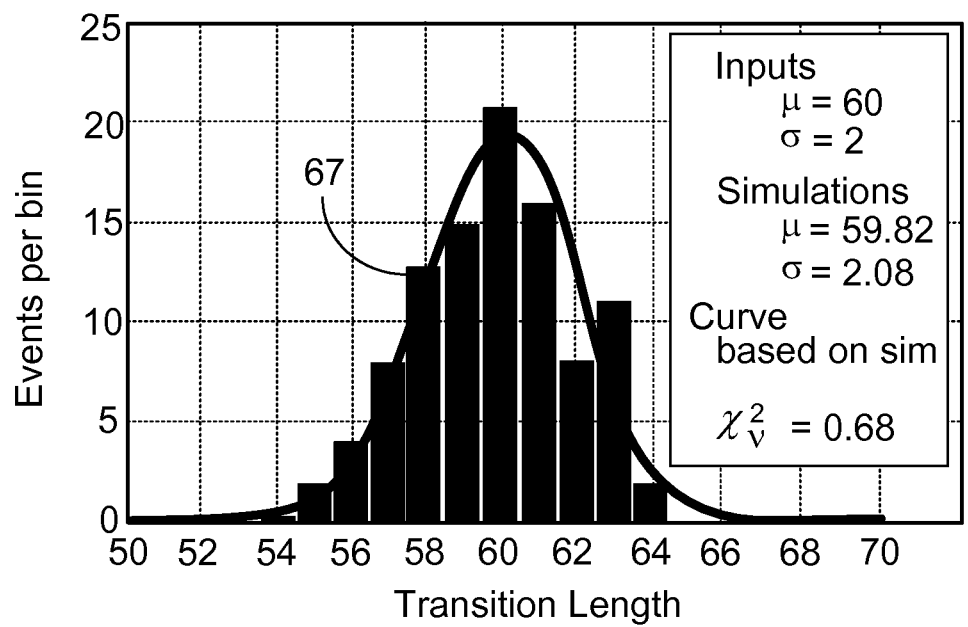
FIG. 7 is a graph that shows a histogram for simulated data with little or no periodic jitter in relation to a Gaussian distribution of that data.

FIG. 7 shows an exemplary transition lengths distribution that has a Gaussian shape. Referring to FIG. 7, a population of 100 transition lengths was generated from a Gaussian distribution of simulated data with parameters {µ=60, σ=2}. A histogram 67 of the data is shown on the FIG. 7. Applying equations (1) and (2) to the data results in values of µ=59.82 and σ=2.08 for the population. Thus, in this example, the events (the transition lengths) have a Gaussian distribution with µ=59.82, and σ=2.08. Applying µ and σ to equations (3), (4) and (5) results in $\chi_v^2$=0.68. Thus, the $\chi_v^2$ value is less than one, which confirms the Gaussian distribution (and relatively low PJ level).

Figure 8:
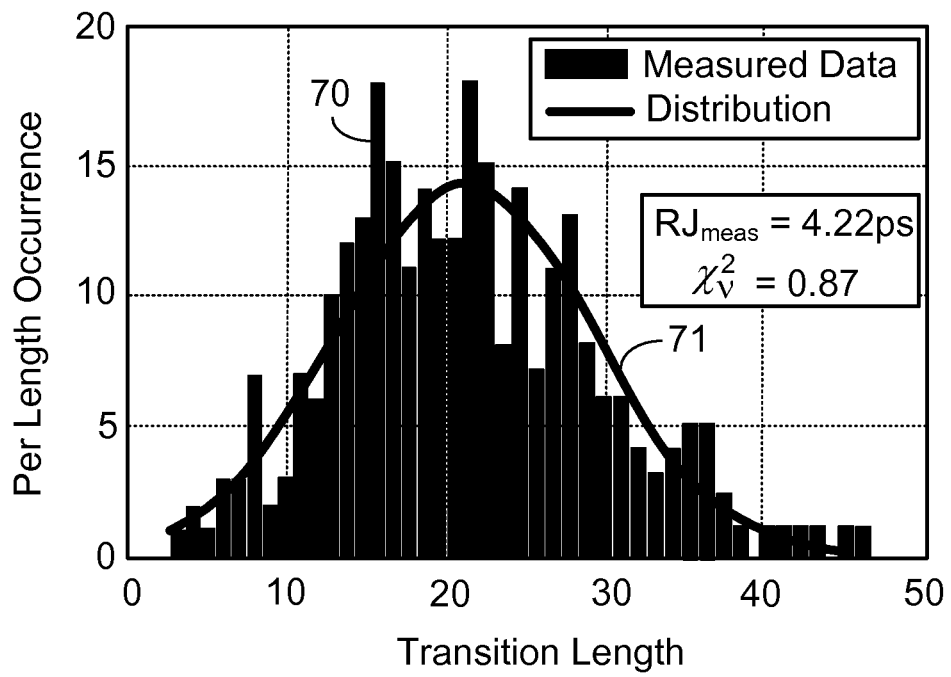
FIG. 8 is a graph showing a distribution for transition lengths of captured data with little, or no, periodic jitter and a histogram of the captured data.
Figure 9:
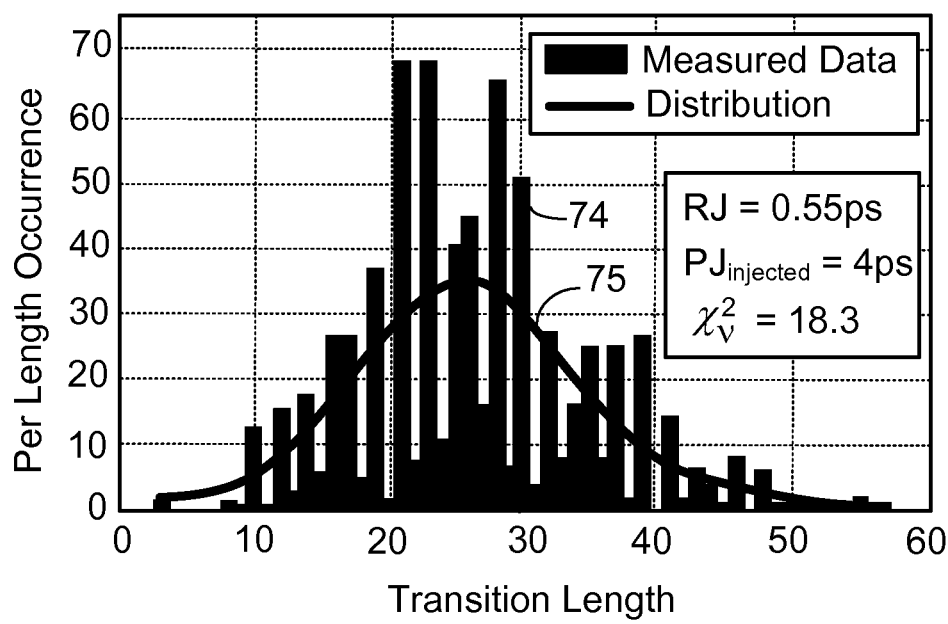
FIG. 9 is a graph showing a distribution for transition lengths of captured data with periodic jitter and a histogram of the captured data.

FIGS. 8 and 9 show distributions confirming results produced by process 60.

FIG. 8 shows a histogram 70 for a set of jitter data having a measured RJ of $RJ_{meas}$=4.22 ps and low, or no, PJ. A $\chi^2$ calculation obtains $\chi_v^2$=0.87. This relatively low value of $\chi_v^2$ implies that the assumed (Gaussian) distribution is a relatively good estimate of the data distribution. The smooth curve 71 shown in FIG. 8 represents a theoretical Gaussian curve built on the µ and σ determined from the measured data, and the area under the curve equals the area of the histogram. As shown in FIG. 8, there is a relatively good match between the theoretical curve and the histogram of the data. The relatively good match indicates the absence of PJ, or at least a relatively low amount of PJ.

As explained above, data that includes PJ has a transition length distribution that deviates from a Gaussian distribution. This PJ pollution can be identified by a large $\chi^2$ value for the transition lengths distribution, i.e., $\chi_v^2$>>1, as follows.

FIG. 9 shows a histogram 74 for a set of jitter data having a measured RJ of $RJ_{meas}$=0.55 ps and an injected PJ=4 ps. A $\chi_v^2$ calculation resulted in $\chi_v^2$=18.3. This relatively high value of $\chi_v^2$ implies that the distribution of transition lengths is not Gaussian. The smooth curve 75 shown in FIG. 9 represents a theoretical Gaussian curve built on the µ and σ determined from the measured data, and the area under the curve equals the area of the histogram. As shown, there is a mismatch between the theoretical curve and the histogram of the data. This mismatch indicates the presence of PJ.

The value, $\chi_v^2$, that is determined for a transition lengths distribution also correlates with an error, ε, of estimated RJ in the data, which is defined as $$\varepsilon = \frac{RJ_{meas} - RJ_{actual}}{RJ_{actual}} \times 100\%.$$

Here $RJ_{meas}$ is determined as follows:

µ=M1, σ=$\sqrt{M2-M1^2}$, where M1 and M2 are the first and second statistical moments of difference values, Δ[i], of successive samples representing a discrete approximation of a PDF for the data. M1 and M2 are determined as follows:

$$M1 = \sum_i (\Delta[i] \times (i + 0.5)),$$

$$M2 = \sum_i \left(\Delta[i] \times ((i + 0.5)^2) + \frac{|\Delta[i]|}{12}\right)$$

Figure 10:
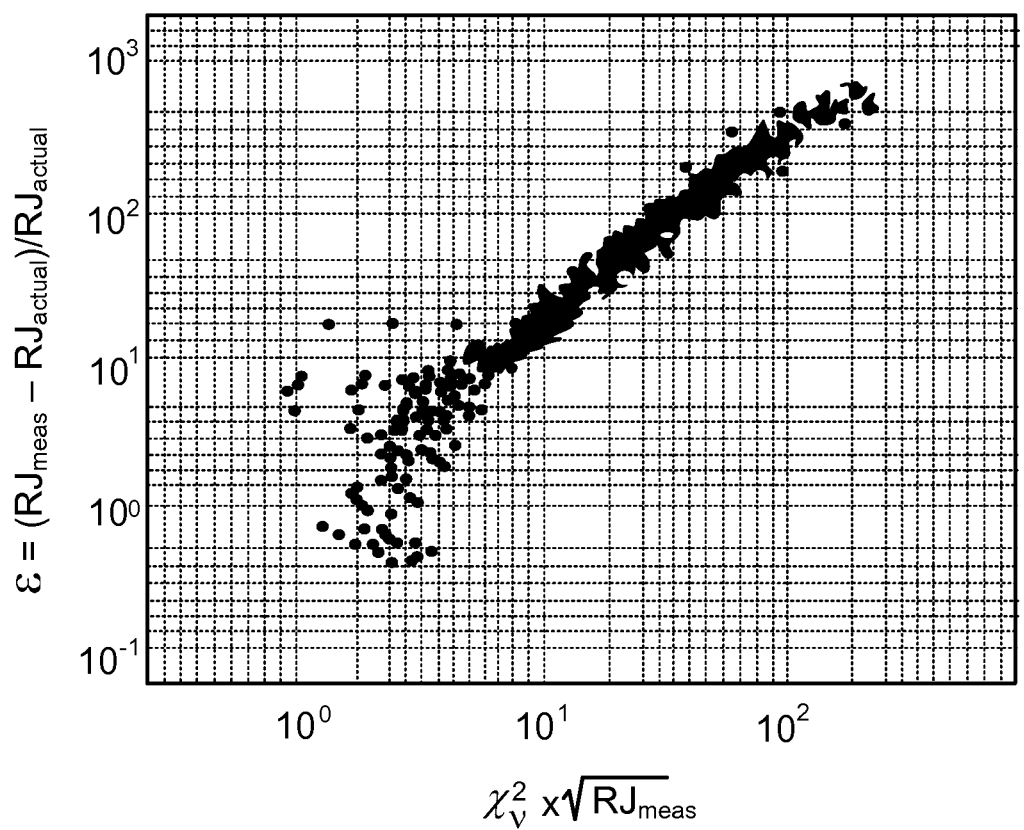
FIG. 10 is a scatter plot of an error in measured random jitter ($RJ_{meas}$) determined in accordance with a comparator sampling algorithm versus $\xi = \chi_v^2 \sqrt{RJ_{meas}}$.

FIG. 10 shows simulation results for 1000 samples having RJ in the range of 1.0 ps to 4.5 ps and PJ in the range of 0.0 ps to 25.0 ps. In the simulations, both ε and $\chi_v^2$ are determined. FIG. 10 shows a scatter plot of ε versus $\xi = \chi_v^2 \sqrt{RJ_{meas}}$. In testing actual devices, a certain level, Q, corresponding to a tolerable error of the measured RJ, can be set, to trigger a warning message if ξ exceeds that level, Q.

Process 60 described above for identifying periodic jitter, and any modifications thereto and related processes described herein (hereinafter "the processes"), are not limited to the hardware and software described above. All or part of the processes can be implemented, at least in part, via a computer program product, i.e., a computer program tangibly embodied in an information carrier, such as one or more machine-readable media or a propagated signal, for execution by, or to control the operation of, one or more data processing apparatus, e.g., a programmable processor, a computer, multiple computers, and/or programmable logic elements.

Actions associated with implementing all or part of the processes can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Process 60 may be used to measure PJ resulting in signals from any type of DUT, including, but not limited to, high-frequency signals from SerDes devices.

Elements of different embodiments described herein may be combined to form other embodiments not specifically set forth above. Other embodiments not specifically described herein are also within the scope of the following claims.

What is claimed is:

1. A method, performed by one or more processing devices, for use in identifying periodic jitter in a digital signal, comprising:
    using the one or more processing devices, identifying transition regions of the digital signal, the transition regions corresponding to regions of the digital signal where the digital signal is switching between a stable zero value and a stable one value, and where the digital signal flips between bit values of zero and one;
    using the one or more processing devices, determining lengths of the transition regions, the lengths of the transition regions corresponding to numbers of bits in the transition regions; and
    using the one or more processing devices, performing a statistical analysis that uses the lengths of the transition regions to obtain a value indicative of a level of periodic jitter in the digital signal, the value comprising an extent to which a distribution of the lengths of the transition regions deviates from a predefined distribution.

2. The method of claim 1, wherein performing the statistical analysis comprises:
    determining the distribution of the lengths of the transition regions;
    determining a mean and a standard deviation of the distribution; and
    performing a chi-square ($\chi^2$) analysis using the lengths, the mean, and the standard deviation in order to obtain the value.

3. The method of claim 2, wherein a higher value obtained through the $\chi^2$ analysis indicates more periodic jitter in the signal than does a lower value obtained through the $\chi^2$ analysis.

4. The method of claim 3, wherein a Gaussian distribution of transition lengths is indicative of pure random jitter, and a level of periodic jitter in the signal corresponds to an amount that the distribution deviates from the Gaussian distribution.

5. The method of claim 2, wherein the mean, μ, is determined as follows:

$$\mu = \frac{\sum_{i=1}^{M} L_i}{M},$$

where $L_i$ corresponds a transition region, and M corresponds to a number of transition regions;
    wherein the standard deviation, σ, is determined as follows:

$$\sigma = \sqrt{\frac{\sum_{i=1}^{M}(L_i - \mu)^2}{M-1}};$$

wherein N(L) corresponds to an occurrence of a transition length L, and $N_b$ corresponds to a number of transition lengths that fall within μ+σ and μ−σ;
    wherein $N(L)_{Theor}$ corresponds to an expected number of transition lengths L, where $N(L)_{Theor}$ is determined as follows:

$$N(L)_{Theor} = \left(\sum_i N(i) - N(1)\right) \times \left[CDF\left(\frac{N(L) + 0.5 - \mu}{\sigma}\right) - CDF\left(\frac{N(L) - 0.5 - \mu}{\sigma}\right)\right],$$

where CDF is a cumulative density function;
    wherein $\chi^2$ is determined as follows:

$$\chi^2 = \sum_{Nb} \frac{(N(L) - N(L)_{Theor})^2}{N(L)_{Theor}}; \text{ and}$$

wherein the value, $\chi_v^2$, which is indicative of a level of periodic jitter in the signal, is determined as follows:

$$\chi_v^2 = \frac{\chi^2}{N_b - 2}.$$

6. The method of claim 1, wherein a transition region is bordered by at least one stable region, the stable region comprising a sequence of bits that do not flip, and wherein a number of bits in the stable region is more than a number of bits in the transition region.

7. The method of claim 6, further comprising:
    using the one or more processing devices, obtaining the bits by undersampling an original signal and reordering resulting samples produced by the undersampling.

8. The method of claim 1, wherein the method is performed by automatic test equipment (ATE), and the digital signal is received at the ATE from a device being tested by the ATE.

9. Automatic test equipment (ATE) comprising:
    a testing device communicatively coupled to a device under test, the testing device comprising circuitry to exchange signals with the device under test, the signals comprising a test signal received from the device under test, the test signal comprising a digital signal; and
    a processing device communicatively coupled to the testing device, the processing device for executing instructions to:

identify transition regions of the test signal, the transition regions corresponding to regions of the test signal where the test signal is switching between a stable zero value and a stable one value, and where the test signal flips between bit values of zero and one;

determine lengths of the transition regions, the lengths of the transition regions corresponding to numbers of bits in the transition regions; and perform a statistical analysis that uses the lengths of the transition regions to obtain a value indicative of a level of periodic jitter in the test signal, the value comprising an extent to which a distribution of the lengths of the transition regions deviates from a predefined distribution.

10. The ATE of claim 9, wherein performing the statistical analysis comprises:
determining the distribution of the lengths of the transition regions;
determining a mean and a standard deviation of the distribution; and
performing a chi-square ($\chi^2$) analysis using the lengths, the mean, and the standard deviation in order to obtain the value.

11. The ATE of claim 10, wherein a higher value obtained through the $\chi^2$ analysis indicates more periodic jitter in the signal than does a lower value obtained through the $\chi^2$ analysis.

12. The ATE of claim 11, wherein a Gaussian distribution of transition lengths is indicative of pure random jitter, and a level of periodic jitter in the signal corresponds to an amount that the distribution deviates from the Gaussian distribution.

13. The ATE of claim 10, wherein the mean, $\mu$, is determined as follows:

$$\mu = \frac{\sum_{i=1}^{M} L_i}{M},$$

where $L_i$ corresponds a transition region, and M corresponds to a number of transition regions;

wherein the standard deviation, $\sigma$, is determined as follows:

$$\sigma = \sqrt{\frac{\sum_{i=1}^{M}(L_i - \mu)^2}{M-1}};$$

wherein N(L) corresponds to an occurrence of a transition length L, and $N_b$ corresponds to a number of transition lengths that fall within $\mu+\sigma$ and $\mu-\sigma$;

wherein $N(L)_{Theor}$ corresponds to an expected number of transition lengths L, where $N(L)_{Theor}$ is determined as follows:

$$N(L)_{Theor} = \left(\sum_i N(i) - N(1)\right) \times \left[CDF\left(\frac{N(L)+0.5-\mu}{\sigma}\right) - CDF\left(\frac{N(L)-0.5-\mu}{\sigma}\right)\right],$$

where CDF is a cumulative density function;

wherein $\chi^2$ is determined as follows:

$$\chi^2 = \sum_{Nb} \frac{(N(L) - N(L)_{Theor})^2}{N(L)_{Theor}}; \text{ and}$$

wherein the value, $\chi_v^2$, which is indicative of a level of periodic jitter in the signal, is determined as follows:

$$\chi_v^2 = \frac{\chi^2}{N_b - 2}.$$

14. The ATE of claim 9, wherein the test signal is a digital signal comprised of bits, and identifying the transition region comprises:
defining a number of bits that comprise a stable region of the signal, the stable region comprising a number of bits having a same level; and
identifying a portion of the bits where bits transition between different levels, the portion comprising a number of bits that is less than a number of bits in the stable region.

15. The ATE of claim 14, wherein identifying the transition region comprises:
obtaining the bits by undersampling an original signal and reordering resulting samples produced by the undersampling.

16. One or more non-transitory machine-readable media comprising instructions that are executable to identify periodic jitter in a signal, the instructions being executable to cause one or more processing devices to:
identify transition regions of the digital signal, the transition regions corresponding to regions of the digital signal where the digital signal is switching between a stable zero value and a stable one value, and where the digital signal flips between bit values of zero and one;
determine lengths of the transition regions, the lengths of the transition regions corresponding to numbers of bits in the transition regions; and
perform a statistical analysis that uses the lengths of the transition regions to obtain a value indicative of a level of periodic jitter in the digital signal, the value comprising an extent to which a distribution of the lengths of the transition regions deviates from a predefined distribution.

17. The one or more non-transitory machine-readable media of claim 16, wherein performing the statistical analysis comprises:
determining the distribution of the lengths of the transition regions;
determining a mean and a standard deviation of the distribution; and
performing a chi-square ($\chi^2$) analysis using the lengths, the mean, and the standard deviation in order to obtain the value.

18. The one or more non-transitory machine-readable media of claim 17, wherein a higher value obtained through the $\chi^2$ analysis indicates more periodic jitter in the signal than does a lower value obtained through the $\chi^2$ analysis.

19. The one or more non-transitory machine-readable media of claim 18, wherein a Gaussian distribution of transition lengths is indicative of pure random jitter, and a level of periodic jitter in the signal corresponds to an amount that the distribution deviates from the Gaussian distribution.

20. The one or more non-transitory machine-readable media of claim 17, wherein the mean, µ, is determined as follows:

$$\mu = \frac{\sum_{i=1}^{M} L_i}{M},$$

where $L_i$ corresponds a transition region, and M corresponds to a number of transition regions;

wherein the standard deviation, σ, is determined as follows:

$$\sigma = \sqrt{\frac{\sum_{i=1}^{M} (L_i - \mu)^2}{M-1}};$$

wherein N(L) corresponds to an occurrence of a transition length L, and $N_b$ corresponds to a number of transition lengths that fall within µ+σ and µ−σ;

wherein $N(L)_{Theor}$ corresponds to an expected number of transition lengths L, where $N(L)_{Theor}$ is determined as follows:

$$N(L)_{Theor} = \left(\sum_i N(i) - N(1)\right) \times \left[CDF\left(\frac{N(L) + 0.5 - \mu}{\sigma}\right) - CDF\left(\frac{N(L) - 0.5 - \mu}{\sigma}\right)\right],$$

where CDF is a cumulative density function;

wherein $\chi^2$ is determined as follows:

$$\chi^2 = \sum_{Nb} \frac{(N(L) - N(L)_{Theor})^2}{N(L)_{Theor}}; \text{ and}$$

wherein the value, $\chi_v^2$, which is indicative of a level of periodic jitter in the signal, is determined as follows:

$$\chi_v^2 = \frac{\chi^2}{N_b - 2}.$$

21. The one or more non-transitory machine-readable media of claim 16, wherein a transition region is bordered by at least one stable region, the stable region comprising a sequence of bits that do not flip, and wherein a number of bits in the stable region is more than a number of bits in the transition region.

22. The one or more non-transitory machine-readable media of claim 21, further comprising instructions to obtain the bits by undersampling an original signal and reordering resulting samples produced by the undersampling.

23. The one or more non-transitory machine-readable media of claim 16, wherein the one or more non-transitory machine-readable media is part of automatic test equipment (ATE), and the digital signal is received at the ATE from a device being tested by the ATE.

24. A method, performed by one or more processing devices, for use in testing a device, comprising:

using the one or more processing devices, attempting to identify periodic jitter in a signal received from the device using a statistical method that is based on a chi-square ($\chi^2$) analysis; and using the one or more processing devices, providing an indication of whether the signal contains periodic jitter;

wherein the statistical method comprises:

determining a distribution of lengths of transition regions in the signal, the signal comprising a digital signal and the transition regions comprising regions of the digital signal where the digital signal is switching between a stable zero value and a stable one value, and where the digital signal flips between bit values of zero and one;

determining a mean and a standard deviation of the distribution; and performing a chi-square ($\chi^2$) analysis using the lengths, the mean, and the standard deviation in order to obtain a value indicative of whether a distribution of the lengths of the transition regions deviates from a Gaussian distribution.

25. The method of claim 24, wherein the mean, µ, is determined as follows:

$$\mu = \frac{\sum_{i=1}^{M} L_i}{M},$$

where L corresponds a transition region, and M corresponds to a number of transition regions;

wherein the standard deviation, σ, is determined as follows:

$$\sigma = \sqrt{\frac{\sum_{i=1}^{M} (L_i - \mu)^2}{M-1}};$$

wherein N(L) corresponds to an occurrence of a transition length L, and $N_b$ corresponds to a number of transition lengths that fall within µ+σ and µ−σ;

wherein $N(L)_{Theor}$ corresponds to an expected number of transition lengths L, where $N(L)_{Theor}$ is determined as follows:

$$N(L)_{Theor} = \left(\sum_i N(i) - N(1)\right) \times \left[CDF\left(\frac{N(L) + 0.5 - \mu}{\sigma}\right) - CDF\left(\frac{N(L) - 0.5 - \mu}{\sigma}\right)\right],$$

where CDF is a cumulative density function;

wherein $\chi^2$ is determined as follows:

$$\chi^2 = \sum_{Nb} \frac{(N(L) - N(L)_{Theor})^2}{N(L)_{Theor}}; \text{ and}$$

wherein a value, $\chi_v^2$, which is indicative of a level of periodic jitter in the signal, is determined as follows:

$$\chi_v^2 = \frac{\chi^2}{N_b - 2}.$$

* * * * *

UNITED STATES PATENT AND TRADEMARK OFFICE
CERTIFICATE OF CORRECTION

PATENT NO. : 8,452,560 B2
APPLICATION NO. : 11/966248
DATED : May 28, 2013
INVENTOR(S) : Vladimir M. Novikov et al.

Page 1 of 1

It is certified that error appears in the above-identified patent and that said Letters Patent is hereby corrected as shown below:

In the Claims

Column 16, line 27, in claim 25, delete "L" and insert -- $L_i$ --, therefor.

Signed and Sealed this
Fourth Day of March, 2014

Michelle K. Lee
*Deputy Director of the United States Patent and Trademark Office*